(12) United States Patent
Durston

(10) Patent No.: US 6,621,562 B2
(45) Date of Patent: Sep. 16, 2003

(54) TIME DOMAIN REFLECTOMETER WITH WIDEBAND DUAL BALANCED DUPLEXER LINE COUPLING CIRCUIT

(75) Inventor: Thomas W. Durston, Oceanside, CA (US)

(73) Assignee: Tempo Research Corporation, Vista, CA (US)

( * ) Notice: Subject to any disclaimer, the term of this patent is extended or adjusted under 35 U.S.C. 154(b) by 0 days.

(21) Appl. No.: 09/967,457

(22) Filed: Sep. 26, 2001

(65) Prior Publication Data

US 2003/0058431 A1 Mar. 27, 2003

(51) Int. Cl.$^7$ ............................................. G01N 21/00
(52) U.S. Cl. ..................... 356/73.1; 324/532; 324/533
(58) Field of Search ..................... 356/73.1; 324/532, 324/533, 534, 535, 527, 870.31, 89, 200; 340/561, 566

(56) References Cited

U.S. PATENT DOCUMENTS

| | | | |
|---|---|---|---|
| 3,771,056 A | * | 11/1973 | Zimmerman ............... 324/57 R |
| 5,000,568 A | * | 3/1991 | Trutna, Jr. et al. ......... 356/73.1 |
| 5,440,528 A | * | 8/1995 | Walsh .......................... 324/532 |
| 5,446,446 A | * | 8/1995 | Harman ....................... 340/556 |
| 5,517,198 A | * | 5/1996 | McEwan ....................... 324/89 |
| 6,100,700 A | * | 8/2000 | Yankielun et al. ........... 324/534 |
| 6,121,894 A | * | 9/2000 | Yankielun et al. ...... 324/870.31 |

* cited by examiner

Primary Examiner—Frank G. Font
Assistant Examiner—Sang H. Nguyen
(74) Attorney, Agent, or Firm—Pillsbury Winthrop LLP

(57) ABSTRACT

A time domain reflectometer transmission line interface includes a pulse driver for generating a transmitted pulse signal. A coupling transformer coupled to the pulse driver couples the transmitted pulse signal to a transmission line and receives a reflected pulse signal from the transmission line. A differential amplifier is coupled to the pulse driver and to the coupling transformer through a network configured such that said transmitted pulse is balanced at the inverting and non-inverting inputs of the differential amplifier.

12 Claims, 2 Drawing Sheets

TIME DOMAIN REFLECTOMETER WITH WIDEBAND DUAL BALANCED DUPLEXER LINE COUPLING CIRCUIT

CROSS-REFERENCE TO RELATED APPLICATIONS

The present Application is related to U.S. application Ser. No. 09/967,633, filed Sep. 26, 2001, titled MULTI-FUNCTION DATA ACQUISITION SYSTEM AND METHOD, and U.S. application Ser. No. 09/967,686, filed Sep. 26, 2001, titled TIME DOMAIN REFLECTOMETER WITH DIGITALLY GENERATED VARIABLE WIDTH PULSE OUTPUT, the disclosures of which are incorporated herein by reference.

FIELD OF THE INVENTION

The present invention relates generally to the field of time domain reflectometers, and more particularly to a line interface circuit that enables a time domain reflectometer to operate without a dead zone.

BACKGROUND OF THE INVENTION

Time domain reflectometry is commonly used within the telephone and cable television industries. A Time Domain Reflectometer ("TDR") sends a pulse down a transmission line and then monitors the transmission line for any reflections of that pulse. Reflections are caused by changes in impedance along the transmission line. A change in impedance may indicate the presence of a fault. As a pulse transmitted by a TDR reaches the impedance mismatch, a portion of the transmitted pulse is reflected back to the TDR. Because the transmitted and reflected pulses travels along the transmission line at a known speed of propagation, the exact location of the impedance mismatch may be determined by measuring the time at which the transmitted pulse is transmitted and the time at which the reflected pulse is received by the TDR.

The magnitude of the reflected pulse is proportional to the magnitude of the impedance mismatch. The sign or polarity of the reflected pulse is determined by the direction of the change in impedance. For example, if the transmitted pulse is positive and the impedance at the fault increases, then the reflected pulse will be positive. A break in the line will result in strong positive reflected pulse. If the transmitted pulse is positive and the impedance at the fault decreases, then the reflected pulse will be negative. For example, a short in the line will produce a negative reflected pulse. Thus, the nature of the fault may be determined or inferred from analysis of the reflected waveforms.

The energy of the transmitted pulse is dependent on the width of the pulse. The larger the pulse width, the more energy is transmitted and therefore the further the signal will travel down the line. Accordingly, many currently available TDRs have a limited number selectable pulse width settings. Each pulse setting produces pulses of substantially identical width. Thus, each pulse of a selected width has a substantially identical frequency spectrum, which can result in electromagnetic interference with digital services on the line.

Conventional TDR pulse generation technology uses low speed logic to generate pulses or analog RLC circuits to generate half-sine wave transmitted pulses. The rise time of conventionally generated pulses is relatively slow, thereby making it very difficult to interpret reflections from some types of faults such as water in the cable, bridge taps, untwisted cable, etc. The slow rise time problem is particularly acute when using long half-sine wave transmitted pulses.

Another problem with currently existing TDRs is they all have a "dead zone" in which reflected pulses arrive back at the TDR before the end of the transmitted pulse. In the dead zone, the reflected pulse is masked by the transmitted pulse. It is impossible to detect faults within the dead zone. The length of dead zone is determined by the width of the transmitted pulse. Thus, the wider the transmitted pulse, the longer the dead zone. Current TDR practice attempts to reduce the length of the dead zone by using short pulses or eliminate the dead zone by connecting the TDR to the system under test by test leads that are longer than the dead zone.

SUMMARY OF THE INVENTION

Briefly stated, the present invention provides a time domain reflectometer transmission line interface the has no dead zone. The line interface includes a pulse driver for generating a transmitted pulse signal. A coupling transformer coupled to said pulse driver couples the transmitted pulse signal to a transmission line and receives a reflected pulse signal from the transmission line. A differential amplifier is coupled to the pulse driver and to the coupling transformer through a network configured such that said transmitted pulse is balanced at the inverting and non-inverting inputs of the differential amplifier. Thus, the differential amplifier produces no output signal in response to the transmitted pulse signal and a time domain reflectometer including the interface of the present invention has no dead zone.

DESCRIPTION OF THE PREFERRED EMBODIMENT

Figure 1:
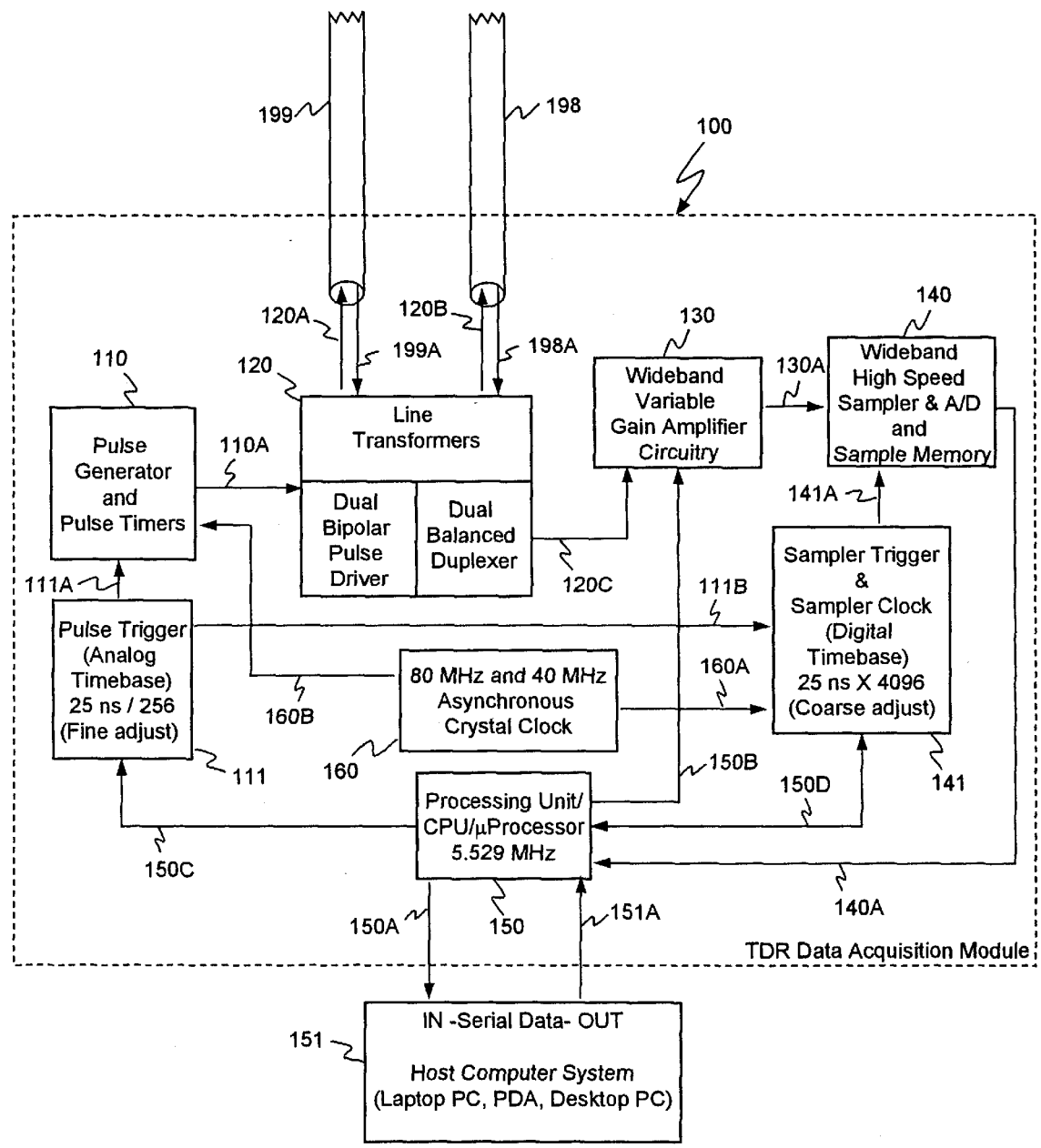
FIG. 1 is a high level block diagram of a time domain reflectometer according to one embodiment of the present invention.

Referring now to the drawings, and first to FIG. 1, a data acquisition system is designated generally by the numeral 100. In the preferred embodiment, data acquisition module 100 incorporates time domain reflectometer (TDR) functionality with spectrum analyzer capabilities. Module 100 generally comprises the following: a pulse generator 110; line transformers 120; high speed wideband variable gain amplifier and attenuation circuitry (amplifier component) 130; a wideband high speed sampler, A/D converter, and sample data storage medium or memory (sampler component) 140; and a processing unit 150. Additionally, module 100 includes a pulse trigger 111, a sampler trigger 141, and an asynchronous clock 160 coupled as illustrated in FIG. 1.

A user at a host computer system 151 may selectively control operational characteristics or functionality of module 100. As indicated in FIG. 1, host computer 151 may be embodied in a desktop personal computer (PC) or workstation, a portable or laptop computer system, a personal digital assistant (PDA), or other electronic equipment or computerized systems having suitable hardware and software to support a two-way data communication coupling to module 100.

In that regard, host computer 151 may be coupled to module 100 using various hardware interfaces and communication protocols known in the art; while this coupling is illustrated as a serial data link in FIG. 1, those of skill in the art will appreciate that bi-directional data communication between processing unit 150 and host computer 151 may be enabled by any hardware interface and data transmission protocol known in the art or developed and operative in accordance with known principles. In some embodiments, for example, module 100 may be coupled to a remote host computer 151 via a wire-line or wireless network connection. Examples of suitable hardware connections and protocols for coupling processing unit 150 and host computer 151 include, but are not limited to: Transmission Control Protocol/Internet Protocol (TCP/IP); Ethernet connections; Fiber Distributed Data Interface (FDDI); ARCNET; token bus or token ring networking technology; Universal Serial Bus (USB) connections; and Institute of Electrical and Electronics Engineers (IEEE) Standard 1394 (typically referred to as "FireWire") connections.

As will be explained in detail hereinafter, pulse trigger 111 controls pulse generation, by transmitting a pulse trigger or pulse enable signal 111A to pulse generator 110. As indicated in FIG. 1, pulse trigger 111 is responsive to a control signal 150C transmitted from processing unit 150, and may fine tune a pulse delay by dividing a default delay time or clock cycle (25 nanoseconds (ns), for example) into a selected one of a predetermined number of increments (256 increments, for example). Accordingly, analog time base pulses may selectively delay pulse trigger signal 111A from a relatively long 25 ns to a relatively short $25/256$ or 0.097 ns.

According to the present invention and as will be explained in detail hereinafter, pulse generator 110 transmits a pulse 110A responsive to pulse enable signal 111A, the width of which pulse is determined according to an asynchronous clock signal 160B from clock 160. Line transformers 120 comprise wideband coupling circuitry capable of operating in the 10 kHz–500 MHz frequency range; in that regard, a dual bipolar pulse driver and a dual balanced duplexer are provided to analyze one or two transmission lines (designated by reference numerals 199 and 198, respectively). In particular, a bipolar pulse driver is operative to alter pulse 110A in a manner appropriate for the specific test to be conducted on line 199 or 198; such a suitable pulse driver may then create and transmit incident pulses 120A and 120B through line 199 or 198, respectively. Incident pulses 120A or 120B may be of any selected frequency and duration specified by processing unit 150 under control of host computer 151. Line 199 or 198 may comprise a twisted pair transmission line, coaxial cable, or other transmission line.

Events or impedance discontinuities existing in line 199 or 198 create reflection pulses 199A or 198A, respectively, which are received by the dual balanced duplexer component of the line transformers 120. In operation, the duplexer may provide amplification of received reflection pulses 199A or 198A; such amplification at the receiver side of line transformers 120 may be a factor of 2 or more (2×) for typical TDR applications and line performance or spectrum analyses. In some embodiments, the duplexer may be additionally configured to attenuate or to cancel incident pulse 120A or 120B or its effects on the receiver side of line transformers 120, minimizing or eliminating the "dead zone" characteristic of conventional TDR equipment.

As indicated in FIG. 1, the duplexer is configured to transmit a signal 120C representative of reflection pulse 199A or 198A to high speed wideband variable gain amplifier component 130. Amplifier component 130 may provide both amplification and attenuation functionality responsive to a control signal 150B transmitted from processing unit 150. Output 130A from amplifier component 130 may be directed to sampler component 140.

As depicted in FIG. 1, sampler component 140 may generally be constituted by a high speed sampler, a high speed A/D converter, and memory for storing sample data. The sampler may sample the input (130A) at discrete time intervals or on a continuous, or streaming, basis; in that regard, sampler operation may be controlled by a sampler trigger signal 141A transmitted by sampler trigger 141 as well as by a control signal 150D transmitted by processing unit 150. Control signal 150D may determine the operational mode in which sampler component 140 functions (i.e. discrete samples or streaming conversion at a particular frequency), while trigger signal 141A may determine the sample rate or frequency employed.

It will be appreciated that sampler trigger 141 may be operative in accordance with timing signals 160A received from clock 160. As is generally known in the art, synchronous clock 160 may be configured to provide signals at two different clock rates, e.g. 80 MHz and 40 MHz, as shown in FIG. 1. In contrast to pulse trigger 111, sampler trigger 141 may employ a digital time base generating signals in increments of 25 ns responsive to timing signal 160A.

In some embodiments, the sampler may provide sample data to the A/D converter, which may subsequently transmit digital data signals (represented by signal 140A) to processing unit 150 immediately; additionally or alternatively, the A/D converter may store digital data samples temporarily in memory.

The memory component may be implemented in random access memory (RAM) chips, for example, or any other suitable data storage medium configured and operative to store or to buffer digital data including, but not limited to: fast static random access memory (SRAM), or transistor-based memory components; erasable programmable read only memory (EPROM); flash memory; various magnetic, optical, or magneto-optical disc media; and the like.

Figure 2:
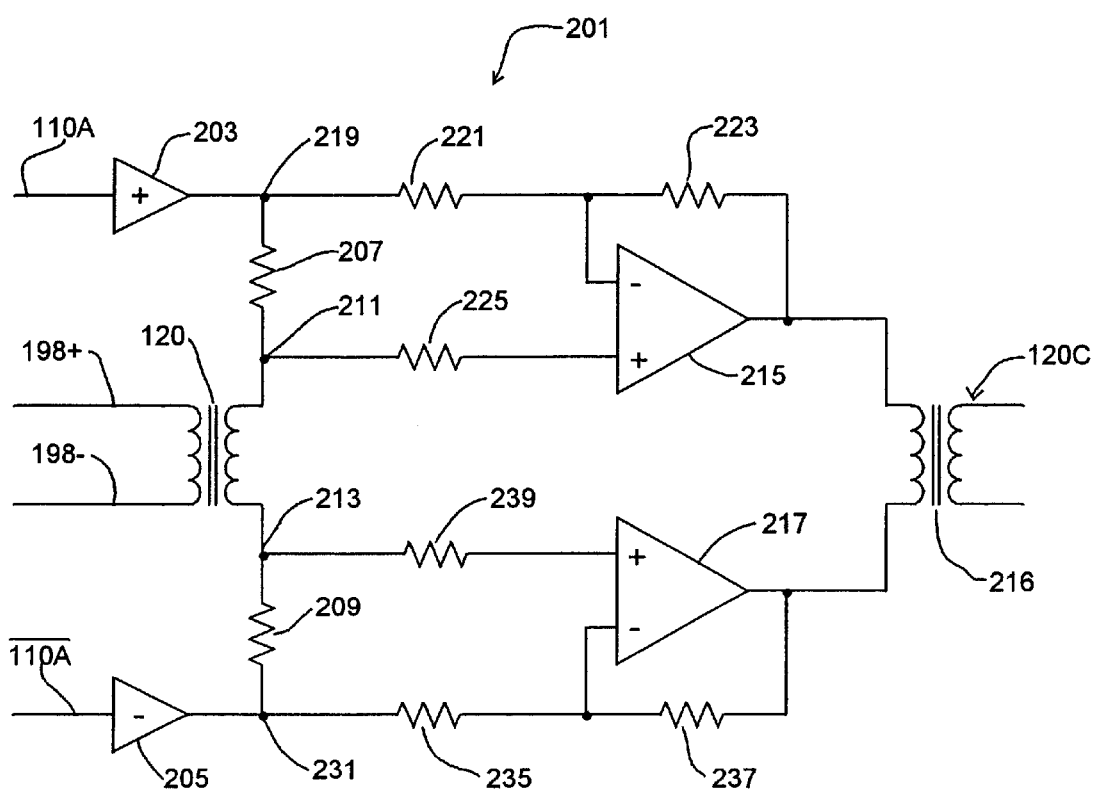
FIG. 2 is a circuit diagram of a transmission line interface according to one embodiment of the present invention.

Referring now to FIG. 2, a line interface circuit according to the present invention is designated generally by the numeral 201. Interface circuit 201 corresponds generally to the dual bipolar pulse driver and dual balance duplexer discussed with respect to FIG. 1. Interface circuit 201 includes a positive pulse buffer driver 203 coupled to receive input signal 110A from pulse generator 110 (FIG. 1). Interface circuit 201 includes a negative pulse buffer driver 205 coupled to receive input signal $\overline{110A}$ from pulse generator 110 (FIG. 1). The generation of input signals 110A and $\overline{110A}$ is described in co-pending U.S. patent application Ser. No. 09/967,686, filed Sep. 26, 2001, titled Time Domain Reflectometer with Digitally Generated Variable Width Pulse Output, the disclosure of which is incorporated herein by reference.

Pulse buffer drivers 203 and 205 are configured to produce output pulses having an amplitude of about +4 volts and −4 volts respectively. For purposes of this disclosure, the magnitude of the pulse produced by positive buffer driver 203 will be referred to as plus TX and the magnitude of the negative pulse produced by negative pulse buffer driver 205 will be referred to as −TX.

The outputs of pulse buffer drivers 203 and 205 are coupled to wideband line transformer 120, which inductively couples the outputs of pulse buffer drivers 203 and 205 to the conductors of the system under test. For example, if system 198 is under test, then the outputs of pulse drivers 203 and 205 are coupled to conductors 198+ and 198−. Transformer 120 also couples reflected signals RX and −RX back to interface 201. The impedance of the system under test is about 100 ohms. Accordingly, resisters 207 and 209, each having a resistance of about 50 ohms, are provided to balance the impedance. The voltage of the transmitted positive pulse at a node 211 is +TX/2. Similarly, the voltage of the negative transmitted pulse at a node 213 is equal to −TX/2.

The dual balanced duplexer portion of the interface circuit of the present invention includes a pair of differential amplifiers 215 and 217. As is well known, each differential amplifier 215 and 217 includes an inverting input, a non-inverting input and an output. The outputs of differential amplifiers 215 and 217 are each coupled to an output transformer 216, which produces output signal 120C. Each differential amplifier 215 and 217 functions in the same way. Accordingly, the discussion of amplifier 215 will apply to amplifier 217.

Amplifier 215 is coupled to nodes 211 and 219 by a network that includes resistors 221–225. Resistor 223 is a feedback resister connected between the output of amplifier 215 and the inverting input of amplifier 215. Resistors 221 and 223 each have the same resistance. Accordingly, the gain of amplifier 215 is two. Also, the voltage of transmitted positive pulse seen at the inverting input of amplifier 215 is +TX/2, which is the same as the voltage of the transmitted pulse seen at the non-inverting input of amplifier 215. Accordingly, with respect to the transmitted pulse, the output of amplifier 215 is zero. The amplitude of a reflected pulse seen at node 211 is RX. Since the gain of amplifier 215 is 2, the amplitude of the reflected pulse at the output of amplifier 215 is 2RX.

In similar fashion, amplifier 217 is coupled to nodes 213 and 231 by a network that includes resistors 235–239. Resistor 237 is a feedback resister connected between the output of amplifier 217 and the inverting input of amplifier 217. Resistors 235 and 237 each have the same resistance. Accordingly, the gain of amplifier 217 is two. Also, the voltage of transmitted positive pulse seen at the inverting input of amplifier 217 is −TX/2, which is the same as the voltage of the transmitted pulse seen at the non-inverting input of amplifier 217. Accordingly, with respect to the transmitted pulse, the output of amplifier 217 is zero. The amplitude of a reflected pulse seen at node 213 is −RX. Since the gain of amplifier 215 is two, the amplitude of the reflected pulse at the output of amplifier 217 is −2RX.

From the foregoing it may be seen that line interface of the present invention overcomes the dead zone problem of the prior art. According to the present invention, the transmitted pulse is not seen at the output of the line interface while the line interface produce a six dB gain on reflected pulses.

The present invention has been illustrated and described with respect to presently preferred embodiments. Those skilled in the art, given the benefit of this disclosure, will recognize alternative embodiments. Accordingly, the foregoing description is intended for purposes of illustration rather than limitation.

What is claimed is:

1. A time domain reflectometer transmission line interface, which comprises:

a pulse driver for generating a transmitted pulse signal;

a coupling transformer coupled to said pulse driver for coupling said transmitted pulse signal to a transmission line and receiving a reflected pulse signal from said transmission line;

a differential amplifier, having a non-inverting input, an inverting input, and an output, said differential amplifier being coupled to said pulse driver and to said coupling transformer through a network means for balancing said transmitted pulse at said inverting and non-inverting inputs, whereby said differential amplifier produces no output signal in response to said transmitted pulse signal.

2. The interface as claimed in claim 1, wherein said differential amplifier has a selected gain.

3. The interface as claimed in claim 2, wherein said selected gain is two.

4. The interface as claimed in claim 1, wherein said network means includes:

a first resistance, having a value, coupled between said pulse driver and said inverting input;

a feedback resistance, having a value, coupled to between said output and inverting input, wherein the values of said first resistance and said feedback resistance have a selected relationship to each other.

5. The interface as claimed in claim 4, wherein the values of said first resistance and said feedback resistance are equal to each other.

6. The interface as claimed in claim 1, including output transformer means for coupling said output of said differential amplifier to other time domain reflectometer circuitry.

7. A dual balanced time domain reflectometer transmission line interface, which comprises:

a positive pulse driver for generating a positive transmitted pulse signal;

a negative pulse driver for generating a negative transmitted pulse signal;

a coupling transformer coupled between said positive pulse driver and said negative pulse driver for coupling said positive and negative transmitted pulse signals to a transmission line and receiving reflected pulse signals from said transmission line;

a first differential amplifier having a non-inverting input, an inverting input, and an output, said differential amplifier coupled to said positive pulse driver and to said coupling transformer through a first network means for balancing said transmitted positive pulse signal at said inverting and non-inverting inputs of said first differential amplifier, whereby said first differential amplifier produces no output signal in response to said transmitted positive pulse signal; and, a second differential amplifier having a non-inverting input, an inverting input, and an output, said differential amplifier coupled to said negative pulse driver and to said coupling transformer through a network means for balancing said negative transmitted pulse signal at said inverting and non-inverting inputs of said second differential amplifier, whereby said second differential amplifier produces no output signal in response to said transmitted negative pulse signal.

8. The interface as claimed in claim 7, wherein each said first and second differential amplifier has a selected gain.

9. The interface as claimed in claim 8, wherein each said first and second differential amplifier has a gain of two.

10. The interface as claimed in claim 7, wherein each said network means includes:

a first resistance, having a value, coupled between said pulse driver and said inverting input;

a feedback resistance, having a value, coupled to between said output and inverting input, wherein the values of said first resistance and said feedback resistance have a selected relationship to each other.

11. The interface as claimed in claim 10, wherein the values of said first resistance and said feedback resistance are equal to each other.

12. The interface as claimed in claim 7, including an output transformer for coupling said output of said differential amplifier to other time domain reflectometer circuitry.

* * * * *